(12) United States Patent
Wu

(10) Patent No.: US 6,551,928 B2
(45) Date of Patent: Apr. 22, 2003

(54) METHOD OF FORMING A SEMICONDUCTOR DEVICE WITH A MULTI-LAYER $WSI_x$ FILM WITH SMALL GRAIN SIZE STRUCTURE

(75) Inventor: Hsiao-Che Wu, Hsinchu (TW)

(73) Assignee: Promos Technologies, Inc., Hsinchu (TW)

( * ) Notice: Subject to any disclaimer, the term of this patent is extended or adjusted under 35 U.S.C. 154(b) by 0 days.

(21) Appl. No.: 09/909,816

(22) Filed: Jul. 23, 2001

(65) Prior Publication Data

US 2002/0155704 A1 Oct. 24, 2002

(30) Foreign Application Priority Data

Apr. 20, 2001 (JP) .......................................... 90109502 A

(51) Int. Cl.[7] .............................................. H01L 21/44
(52) U.S. Cl. ....................... 438/683; 438/630; 438/649; 438/655; 438/664; 438/682
(58) Field of Search ................................. 438/664, 649, 438/648, 655, 630, 682, 683, 656, 582, 583, 592

(56) References Cited

U.S. PATENT DOCUMENTS

| | | | |
|---|---|---|---|
| 4,816,425 A | 3/1989 | McPherson | |
| 5,558,910 A | * 9/1996 | Telford et al. | 148/DIG. 19 |
| 5,646,070 A | 7/1997 | Chung | |
| 6,133,149 A | * 10/2000 | Yeh | 438/653 |
| 6,210,813 B1 | * 4/2001 | Burke et al. | 428/450 |

* cited by examiner

Primary Examiner—Carl Whitehead, Jr.
Assistant Examiner—Thanhha Pham
(74) Attorney, Agent, or Firm—Stevens, Davis, Miller & Mosher, LLP

(57) ABSTRACT

A method of forming a semiconductor device with a polysilicon layer having a multi-layer tungsten-silicide ($WSi_x$) film formed on a surface thereof includes the steps of (1) forming a first layer of tungsten-silicide on the surface of the polysilicon layer; (2) forming a second layer of a material selected from tungsten and silicon on the first layer; (3) forming a third layer of tungsten-silicide on the second layer; and (4) thermally treating the multi-layer film resulting from steps (a)–(c) to form a multi-layer $WSi_x$ film on the surface of the polysilicon layer, the multi-layer $WSi_x$ film having a uniform small grain size. In various embodiments, steps (1)–(3) may be repeated one or more times. A semiconductor device includes a semiconductor body having a polysilicon layer formed on a surface thereof and a multi-layered $WSi_x$ film formed on a surface of the polysilicon layer by the process described above.

13 Claims, 4 Drawing Sheets

METHOD OF FORMING A SEMICONDUCTOR DEVICE WITH A MULTI-LAYER WSI$_x$ FILM WITH SMALL GRAIN SIZE STRUCTURE

BACKGROUND OF THE INVENTION

1. Field of the Invention

The present invention relates to the field of semiconductor devices and methods of manufacture thereof.

2. Description of Related Art

In general, gate structures of many semiconductor devices employ multiple layer gate and interconnect materials which maintain the properties of polycrystalline silicon but add a high-conductivity layer on top. For example, polysilicon and tungsten-silicide layers (WSi$_x$) are commonly used for this purpose. That is, semiconductor devices that employ polycrystalline silicon (polysilicon) gates formed over a gate dielectric layer encounter increased resistance of the polysilicon as size is scaled down to achieve higher circuit density. Due to the resulting relatively high resistance values of the polysilicon layer, a tungsten silicide (WSi$_x$) layer is often formed in order to lower resistance along the polysilicon gate. Generally, the ratio of silicon to tungsten is approximately 2.6 to 1 within the tungsten silicide (WSi$_x$) layer. Initially, problems emerged with adhesion of the metal silicide to the polysilicon.

One method for making semiconductor devices of higher density and improved performance is disclosed by McPherson (U.S. Pat. No. 4,816,425). McPherson teaches a semiconductor device having a gate 11 comprising a multi-layer structure including a layer 11a of polycrystalline silicon with an overlying layer of refractory metal silicide 11b, such as MoSi2 or Wsi2. In McPherson, the problem of adhesion of the metal silicide to the polysilicon is addressed by forming a thin silicon oxide coating 11c on the polysilicon before sputtering the metal silicide layer. The resulting multi-layer structure has low resistance but retains the advantages of polysilicon on silicon.

Chung (U.S. Pat. No. 5,646,070) teaches a single process for creating a multi-layered semiconductor device that employs tungsten silicide but incorporates an intervening layer that prevents degradation of the electrical properties of the underlying silicide during the fabrication process. Since CVD-tungsten involves fluorine chemistry, such a protective layer prevents the interaction during fabrication of the vapor deposited by CVD-tungsten with the underlying silicide.

Neither of these multi-layer methods addresses modifying the WSi$_x$ layer itself to increase device density or speed. Further reducing semiconductor dimensions while maintaining or increasing performance is an on-going objective of semiconductor device design. Because of the large number of gates employed in semiconductor devices, a reduction in gate size can result in a substantial reduction in the overall dimensions of the semiconductor device accompanied by increased device density and even increased device speed.

The shrinkage of gate dimension increases resistivity and decreases speed. There are two usual approaches for decreasing resistivity. The first approach decreases the x-ratio, and the second approach increases the thickness of WSi$_x$. However, these two approaches increase the grain size of WSi$_x$ and result in a rough surface. In particular, a decrease in x-ratio from x=2.3 to x=2.1 actually increases WSi$_x$ grain size after anneal. This increase in WSi$_x$ grain size results in increased surface roughness. Also, increased thin film grain size results in increased side-wall roughness after gate conductor (GC) etching as well as increased likelihood of gate conductor side-wall extension, thereby reducing realizable device density. The lowering of the x-ratio is not feasible as an approach to achieving a decrease in WSi$_x$ thickness, because of these undesirable increases in surface and side-wall roughness.

The conventional structure of (WSi$_x$) film employed in semiconductor devices is a single layer. After the anneal step of a typical semiconductor thin film fabrication process employing a single $_{WSix}$ layer, WSi$_x$ grains grow larger and aggregate in a single grain layer with the grain boundary reaching to the Poly/WSi$_x$ and WSi$_x$/SiN interfaces. These larger grains introduce a WSi$_x$ surface with significant roughness, which results in semiconductor devices with reduced gate density. The roughness after anneal of a prior art WSi$_x$ film with x-ratio of 2.59 and with a thickness of THK=568.6 nm is unacceptable.

SUMMARY OF THE INVENTION

The present invention provides a method of preparing small grain size WSi$_x$ structures in general, and in particular, of preparing gate conductors.

The present invention provides a method of decreasing resistivity but preventing larger grain size by introducing a multilayer structure of WSi$_x$.

More particularly, the present invention is directed to a method for manufacturing a WSi$_x$ film with smaller grains by providing a multi-layer WSi$_x$ structure. The WSi$_x$ film is prepared with smaller grains after anneal by introducing a multi-layer WSi$_x$ structure prior to anneal. Instead of the single WSi$_x$ layer of the prior art, the present invention introduces a multi-layer WSi$_x$ structure at deposition, so that a multi-layer WSi$_x$ grain structure with each layer having a smaller and more uniform grain size results after anneal.

DETAILED DESCRIPTION OF THE PREFERRED EMBODIMENTS

The method of the present invention achieves multi-layer uniform small grain WSi$_x$ films Which result from depositing several thin WSi$_x$ layers separated by a single Si or W layer between each this WSi$_x$ layer. In a first aspect of the present invention, at anneal the nucleation site occurs at each WSi$_x$/W or WSi$_x$/Si interface of the multi-layer WSi$_x$ structure, resulting in a multi-layer $WSi_x$ grain structure after anneal (see FIG. 4a). In a second aspect of the present invention, the thickness of the W or Si layer interposed between the $WSi_x$ layers is very thin, at anneal the nucleation site is in the W or Si layer, resulting in a multi-layer $WSi_x$ grain structure after anneal (see FIG. 4b). Further, the grain size of the multi-layer $WSi_x$ after anneal is smaller than the prior art single $WSi_x$ layer after anneal, so that after anneal the surface of the multi-layer $WSi_x$ film of the present invention is smoother than the prior art single layer $WSi_x$ after anneal.

Figure 2:
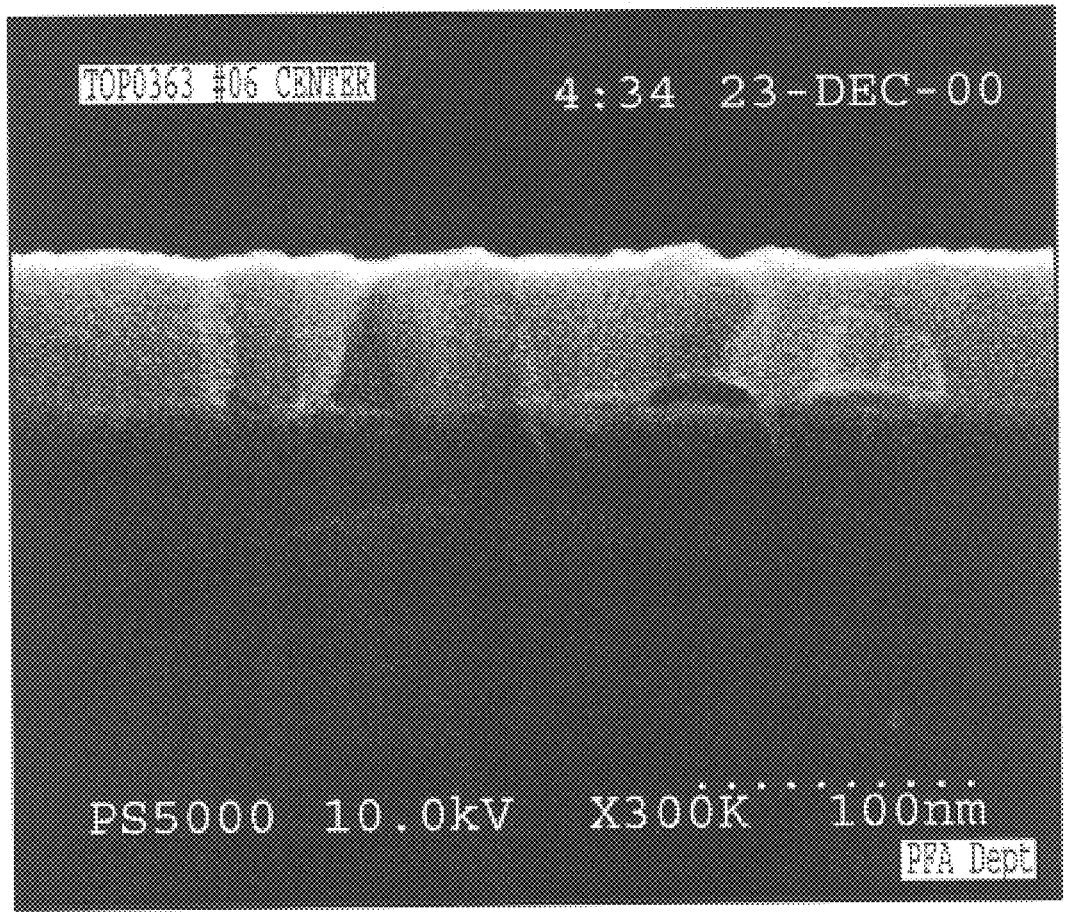
FIG. 2 illustrates the actual surface roughness after anneal of a single layer WSi$_x$ film.
Figure 3:
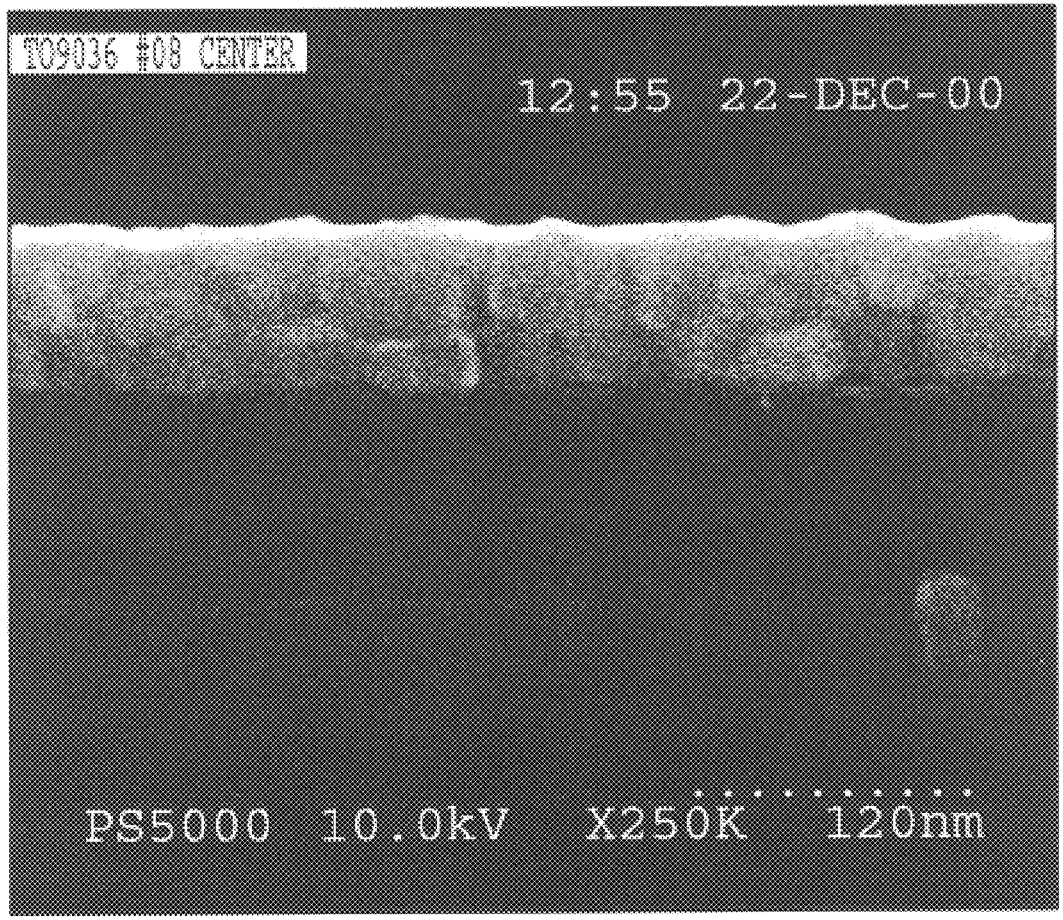
FIG. 3 illustrates actual reduced surface roughness after anneal of a multi-layer WSi$_x$ film according to the present invention.

FIG. 3 shows a multi-layer $WSi_x$ stricture with an x-ratio of 1.98, THR (dimension shape thickness)=798.9 nm after anneal (830 degrees C/60 seconds and 1080 degrees C/94 seconds) according to the present invention. This structure, after anneal, is smoother than the single $WSi_x$ structure shown in prior art FIG. 2 where the x-ratio=2.59, and THR=598.6 nm after anneal (830 degrees C/60 seconds and 1080 degrees C/94 seconds). As noted, the smoother two-layer $WSi_x$ structure of FIG. 3 has a thickness of THK=798.9 nm, compared to a thickness of THR=598.9 nm of the single layer $WSi_x$ film of the prior art, thereby demonstrating its smaller $WSi_x$ grain size.

Figure 1:
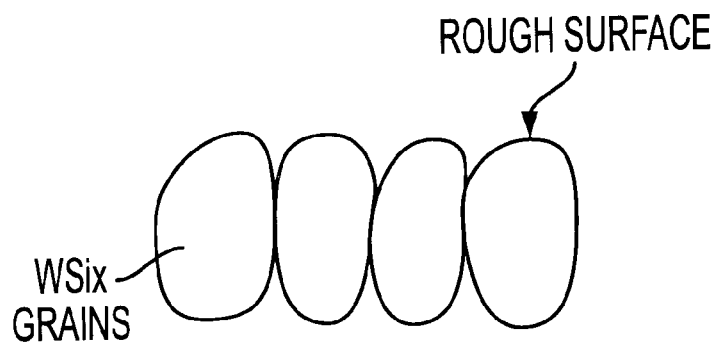
FIG. 1 illustrates the rough surface of a single WSi$_x$ thin film grown according to the prior art.
Figure 4A:
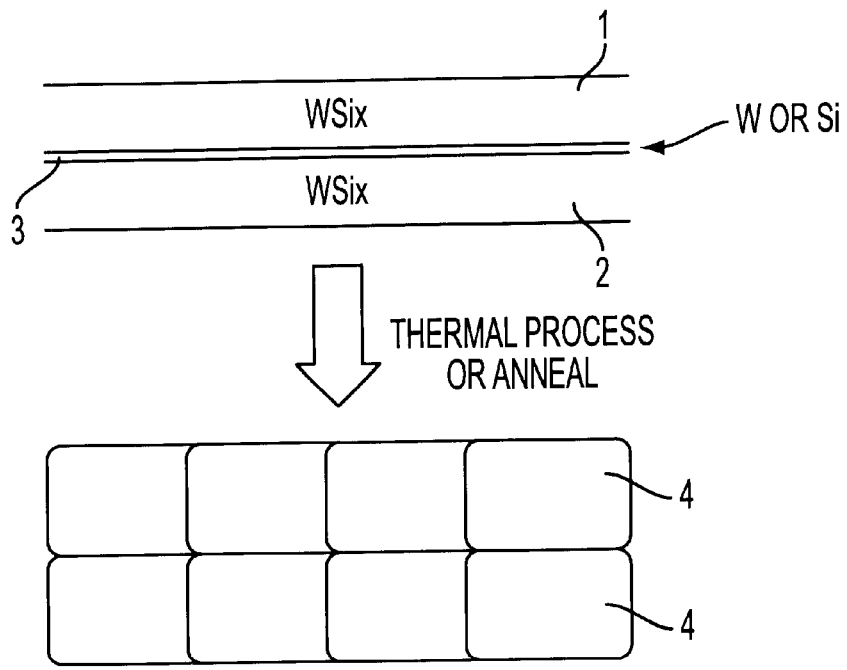
FIG. 4a illustrates the reduced grain size WSi$_x$ film resulting after anneal from a first embodiment of the present invention Which is directed to an initial three-layer WSi$_x$ structure.

Preferred embodiments of the present invention employ multiple $WSi_x$ layers separated by W or Si layers. A first embodiment of the present invention, illustrated in FIG. 4a, comprises two $WSi_x$ layers, i.e., base layer 2 deposited on the semiconductor device and layer 1, with layers 1 and 2 being separated by a W or Si layer 3, resulting in a three-layer structure. In this embodiment, if the total thickness of layers 1, 2 and 3 is T, the thickness of layer 3, W (or Si), is in the range of about T/5 to T/2. The x-ratio of the base layer 2 can be identical to or greater than the x-ratio of layer 1 and the thickness of the layers can vary. In a preferred embodiment, the x-ratio of the base layer 2 is greater than that of layer 1 to prevent unstable gate electricity and the thickness of the base layer 2 is thinner to achieve reduced resistivity of the film. Thus, in the preferred embodiment, the final two-layer grain structure, following subsequent thermal processing or anneal (>1000° C.), has two $WSi_x$ layers of different thicknesses. The $WSi_x$ layers have different grain sizes resulting from their different thicknesses, and within each $WSi_x$ layer, the grain sizes are uniform. Also, in a preferred embodiment, the thickness of the base layer 2 is thinner than the other $WSi_x$ layer 1 to reduce resistivity of the multi-layered film with fixed total thickness T. When the thicknesses of the two $WSi_x$ layers 1 and 2 are equal, the resulting two-layer grain structure, as shown in FIG. 4a, contains two layers of uniform grains 4 of smaller size than the grains of the single $WSi_x$ layer of the prior art shown in FIG. 1. The W (or Si) layer is of sufficient thickness so that nucleation occurs in the $WSi_x$ and W (or Si) interfaces.

Figure 4B:
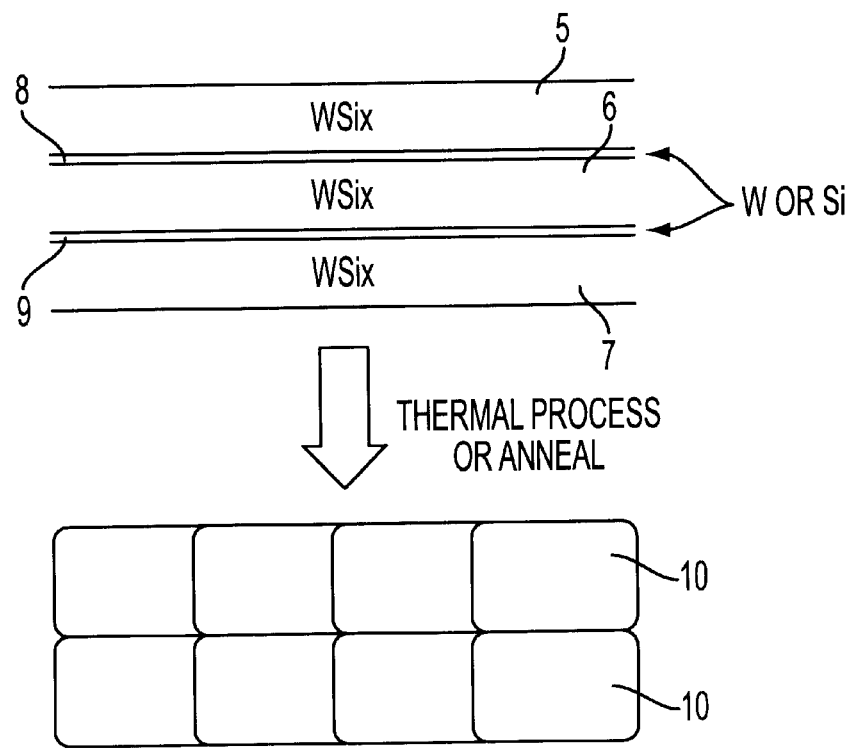
FIG. 4b illustrates the reduced grain size WSi$_x$ film resulting after anneal from a second embodiment of the present invention Which is directed to a five-layer WSi$_x$ structure.

A second embodiment of the present invention is illustrated in FIG. 4b. This second embodiment comprises a fixed total thickness T of at least three $WSi_x$ layers, i.e., layers 5, 6 and base layer 7. The $WSi_x$ layers 5 and 6 are separated by a very thin W or Si layer 8, and the $WSi_x$ layers 6 and 7 are separated by very thin W or Si layer 9. The thickness of each W or Si layer is in the range of about 10 Å to 20 Å. This five-layer structure becomes a multi-layer structure after subsequent thermal processing (or annealing), and since the thickness of W or Si layer 8, 9 is very thin, the nucleation occurs in each W or Si layer itself. The grain structure of each layer of the resulting $WSi_x$ layers contains uniform grains 10 which are of smaller size than the grains of a comparable single $WSi_x$ layer of the prior art and which are of comparable size to the grains achieved by using the three-layer $WSi_x$ structure of the first embodiment. The x-ratios and thicknesses of $WSi_x$ layers 5, 6 and 7 may be the same or different, but in a preferred embodiment the x-ratio of the base layer 7 is higher than each of the other $WSi_x$ layers to prevent unstable gate electricity and the thickness of the base layer 7 is thinner than each of the other $WSi_x$ layers to reduce resistivity of this multi-layer film having a fixed total thickness T.

It should be noted that in FIG. 4a, the total thickness of layers 1-3-2 is in the range of about 400–1200 Å. In FIG. 4b, the total thickness of layers 5-8-6-9-7 is in the range of about 400–1200 Å.

According to a preferred embodiment, a process for producing a three-layer $WSi_x$ structure is (a) $WSi_x$ deposition by CVD, (b-1) W deposition by CVD or (b-2) Si deposition by thermal decomposition, and (c) $WSi_x$ deposition by CVD, each according to the following constraints, as applicable:

$WSi_x$ (1.5–5 sccm gas)$WF_6$+(60–200 sccm gas) $SiH_2Cl_2$; in a range of about 400–600 degrees C., for a total thickness of $WSi_x$ of about 400–1200 Å; in a range of 1–1.7 Torr; it should be noted that process time depends upon thickness and recipe.

W (100–140 sccm gas) $WF_6$+(60–200 sccm gas) $H_2$; in a range of about 400–600 degrees C.; in a range of 30–90 Torr.

Si

Si film is deposited by thermal decomposition of SiH or $SiH_2Cl_2$ in the range of about 400 to 600 degrees C.

A high flow rate (e.g., 100–300 sccm of $SiH_2Cl_2$ is needed to ensure that the deposited film is $WSi_x$ and not W. During film deposition, $WSi_2$ forms with excess Si collecting in the grain boundaries. Since an excess of silicon exists in such films, the chemical formula to denote them is given as $WSi_x$.

Figure 5:
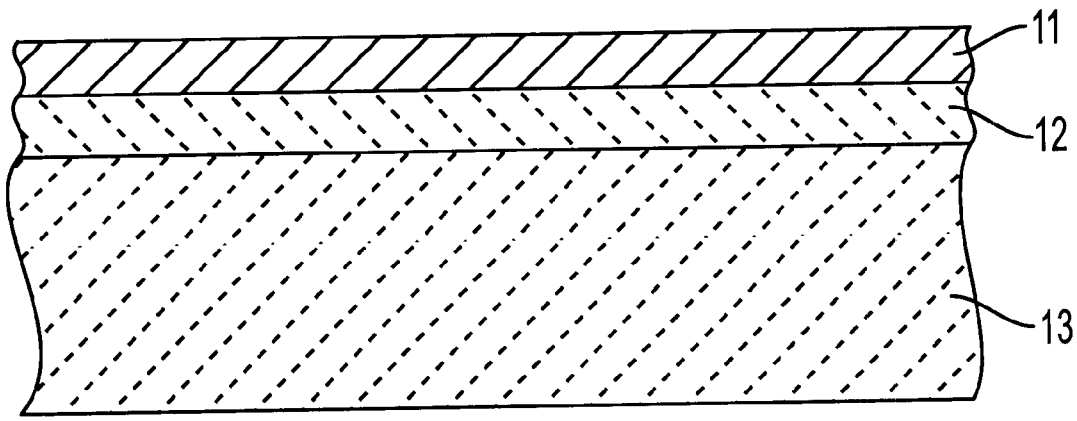
FIG. 5 shows a semiconductor device With a multi-layered WSi$_x$ film formed on a semiconductor body, according to the present invention.

FIG. 5 shows a semiconductor device including a multi-layered $WSi_x$ film 11 formed on a polysilicon layer 12 provided on silicon semiconductor body 13 such as a gate dielectric layer. $WSi_x$ film 11 is formed on the polysilicon layer by either the process of FIG. 4a or FIG. 4b as described above. The semiconductor device is an integrated circuit structure including a semiconductor substrate on which any combination of active and/or passive devices have already been formed and over which a polysilicon layer 12 will be formed to provide contacts and/or interconnects with the underlying integrated circuit structure. The tungsten silicide layer 11 is formed on the polysilicon layer according to a process as described above.

From the foregoing, it will be apparent to those skilled in the art that, although the present invention has been fully described by way of examples with reference to the accompanying drawings, numerous modifications, substitutions and variations, as well as rearrangements and combinations, of the preceding illustrative embodiments can be made without departing from the spirit and scope of the novel aspects of the present invention. It is to be understood that no limitation of the scope of the present invention with respect to the specific embodiments illustrated is intended or should be inferred, but the scope of the present invention is to be defined solely by the attached claims.

What is claimed is:

1. A method of forming a semiconductor device having a multi-layer tungsten-silicide ($WSi_x$) film formed on a surface thereof, said method comprising the steps of:
   (a) providing a semiconductor substrate having a surface;
   (b) forming a first layer of tungsten-silicide on the surface
   (c) forming a second layer of tungsten on said first layer;

(d) forming a third layer of tungsten-silicide on said second layers and (e) thermally treating the multi-layer film resulting from steps (a)–(d) to form a WSi$_x$ film having a plurality of layers, each laves of said plurality of layers having a uniform grain size.

2. A method according to claim 1, comprising repeating steps (c)–(d) one or more times.

3. A method according to claim 2, wherein step (c) comprises depositing said tungsten layer by chemical vapor deposition according to the formula (100–140 sccm gas) WF$_6$+(60–200 sccm gas) H$_2$, at a temperature in the range of about 400–600 degrees C. and at a pressure in the range of about 30–90 Torr.

4. A method according to claim 3, wherein a total thickness of said first layer deposited by step (b) and all repetitions of steps (c)–(d) is in a range of about 400–1200 Å.

5. A method according to claim 4, wherein step (e) comprises an annealing process at greater than about 1000 degrees C.

6. A method according to claim 3, wherein step (c) comprises depositing tungsten in a thickness in the range of about 10 Å to 20 Å.

7. A method according to claim 2, wherein said layer formed by step (b) is thinner and has a higher x-ratio than each said layer formed by step (d), wherein said x-ratio is defined as the ratio of silicon to tungsten, by weight.

8. A method according to claim 1, wherein a total thickness of said first, second and third layers is T, and said second layer is of thickness in a range of about T/5 to T/2.

9. A method according to claim 8, wherein a total thickness of acid first, second and third layers is in a range of about 400–1200 Å.

10. A method according to claim 8, wherein step (e) comprises as annealing process at greater then 1000 degrees C.

11. A method according to claim 1, wherein steps (b) and (d) comprise chemical vapor deposition according to the chemical formula:

(1.5–5 sccm gas) WF$_6$+(60–200 sccm gas) SiH$_2$Cl$_2$, at a temperature in the range of about 400–600 degrees C. and a pressure in the range of about 1–1.7 Torr.

12. A method according to claim 1, wherein said semiconductor device is provided with a polysilicon layer with said multi-layer tungsten-silicide (WSi$_x$) film formed on a surface of said polysilicon layer.

13. A method according to claim 1, wherein said first layer is disposed on said surface of said semiconductor device and said first layer is thinner and has a higher x-ratio than said third layer, wherein said x-ratio is defined as the ratio of silicon to tungsten, by weight.

* * * * *